United States Patent
Grodzki et al.

(10) Patent No.: US 9,726,739 B2
(45) Date of Patent: Aug. 8, 2017

(54) METHOD AND APPARATUS FOR OPTIMIZATION OF A PULSE SEQUENCE FOR A MAGNETIC RESONANCE SYSTEM

(71) Applicants: David Grodzki, Erlangen (DE); Mathias Nittka, Baiersdorf (DE)

(72) Inventors: David Grodzki, Erlangen (DE); Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 606 days.

(21) Appl. No.: 14/057,393

(22) Filed: Oct. 18, 2013

(65) Prior Publication Data

US 2015/0108975 A1 Apr. 23, 2015

(30) Foreign Application Priority Data

Oct. 18, 2012 (DE) .......................... 10 2012 219 016

(51) Int. Cl.
| | | |
|---|---|---|
| *G01V 3/00* | (2006.01) | |
| *G01R 33/54* | (2006.01) | |
| *G01R 33/385* | (2006.01) | |
| *G01R 33/561* | (2006.01) | |

(52) U.S. Cl.
CPC ......... *G01R 33/543* (2013.01); *G01R 33/385* (2013.01); *G01R 33/5617* (2013.01)

(58) Field of Classification Search
USPC ....................................................... 324/309
See application file for complete search history.

(56) References Cited

U.S. PATENT DOCUMENTS

| | | |
|---|---|---|
| 6,008,647 A | 12/1999 | Zhou et al. |
| 6,198,282 B1 | 3/2001 | Dumoulin |
| 2009/0212772 A1* | 8/2009 | Ookawa ............. G01R 33/5615 324/309 |
| 2013/0200893 A1* | 8/2013 | Heismann .......... G01R 33/3854 324/314 |

(Continued)

OTHER PUBLICATIONS

Leupold et al., "Moment and Direction of the Spoiler Gradient for Effective Artifact Suppression in RF-Spoiled Gradient Echo Imaging," Magnetic Resonance in Medicine, vol. 60, pp. 119-127, (2008).

(Continued)

*Primary Examiner* — Rodney Fuller
(74) *Attorney, Agent, or Firm* — Schiff Hardin LLP

(57) ABSTRACT

In a method and a pulse sequence optimization device to optimize a pulse sequence for a magnetic resonance system, wherein pulse sequence includes at least one refocusing pulse, a readout gradient pulse temporally situated after the refocusing pulse, and at least one readout spoiler pulse, the pulse duration of the readout gradient pulse is shortened while keeping the readout gradient moment constant, and the pulse shape of the readout spoiler pulse is adapted without changing a total spoiler moment. An optimally shortened pulse duration of the readout gradient pulse is achieved when, with the adaptation of the pulse shape of the readout spoiler pulse, a maximum amplitude of the readout spoiler pulse equals to the amplitude of the readout gradient pulse, and an edge steepness of the readout spoiler pulse is minimized.

9 Claims, 5 Drawing Sheets

(56) References Cited

U.S. PATENT DOCUMENTS

| | | | |
|---|---|---|---|
| 2014/0111200 A1* | 4/2014 | Grodzki | G01R 33/4833 324/309 |
| 2014/0232396 A1* | 8/2014 | Grodzki | G01R 33/543 324/309 |
| 2015/0160317 A1* | 6/2015 | Grodzki | G01R 33/543 702/57 |

OTHER PUBLICATIONS

Boller, "Dedicated Sequences for Auditory fMRI," Dissertation, Basel, Kap. 8, pp. 160-201, (2007).

\* cited by examiner

METHOD AND APPARATUS FOR OPTIMIZATION OF A PULSE SEQUENCE FOR A MAGNETIC RESONANCE SYSTEM

BACKGROUND OF THE INVENTION

Field of the Invention

The present invention concerns a method to optimize a magnetic resonance pulse sequence that includes at least one refocusing pulse, a readout gradient pulse that occurs temporally after the refocusing pulse, and at least one readout spoiler pulse, for operating a magnetic resonance system. Moreover, the invention concerns a method to operate a magnetic resonance system using such an optimized pulse sequence, and a pulse sequence optimization device for a magnetic resonance system in order to implement this method.

Description of the Prior Art

In a magnetic resonance system (also called a magnetic resonance tomography system), the body to be examined is typically exposed to a relatively high basic magnetic field (for example of 1, 5, 3 or 7 Tesla) with the use of a basic field magnet system. A magnetic field gradient is additionally applied by a gradient system. Radio-frequency excitation signals (RF signals) are then emitted by a radio-frequency transmission system by means of suitable antennas, which causes nuclear spins of specific atoms, excited to resonance by this radio-frequency field, to be flipped by a defined flip angle relative to the magnetic field lines of the basic magnetic field. Upon relaxation of the nuclear spins, radio-frequency signals (known as magnetic resonance signals) are radiated that are received by suitable reception antennas, and are then processed further. Finally, the desired image data can be reconstructed from the raw data acquired in such a manner.

For a defined measurement, a defined pulse sequence must be emitted, which includes a series of radio-frequency pulses (in particular excitation pulses and refocusing pulses) and gradient pulses that are emitted in coordination in different spatial directions, as well as suitably placed readout windows during which the induced magnetic resonance signals are detected. The timing within the sequence—i.e. the time intervals at which pulses follow one another—is particularly significant to the imaging. A number of control parameters are normally defined in a measurement protocol, which is created in advance and, for a defined measurement, can be retrieved (from a memory, for example) and possibly modified on site by the operator, who can predetermine additional control parameters (for example a specific slice interval of a stack of slices to be measured, a slice thickness etc.). A pulse sequence (which is also designated as a measurement sequence) is then calculated on the basis of all of these control parameters.

The gradient pulses are defined by their gradient amplitudes, the gradient pulse duration and their edge steepness dG/dt (typically also designated as a "slew rate"). An additional important gradient pulse variable is the gradient pulse moment that is defined by the integral of the amplitude over time.

During a pulse sequence, the magnetic gradient coils with which the gradient pulses are emitted are switched frequently. Eddy currents that are then produced in other components of the magnetic resonance tomography (in particular the radio-frequency shield) and interact with the magnetic fields to produce Lorentz forces, which are one reason for the well-known noise generation during the switching of the gradients. In particular, a high edge steepness contributes to the noise exposure. In addition, steep edges lead to a higher power consumption and additionally place higher demands on the hardware. The rapidly changing gradient fields lead to distortions and oscillations in the gradient coils and to the transmission of these energies to the apparatus housing.

In order to reduce the noise exposure, different solutions have been proposed in the design of the hardware, for example potting or vacuum-sealing the gradient coils. Another possibility is to pay particular attention to the gradient curve already in the calculation of the pulse sequences. In practice, there are therefore apparatuses that offer what are known as different "gradient modes". The operator can choose between a normal mode and a particularly quiet gradient mode, for example. In the quiet gradient mode, a maximum allowable edge steepness for the gradient pulses is set to a lower value, which leads to the situation that the measurement is quieter than in a normal mode. A disadvantage in the selection of such a quiet gradient mode is that not only is the measurement time made longer overall, but also the image quality (for example the contrast and/or the resolution) is reduced. Given such a limitation of the overall maximum slew rate, a compromise must always be found between the reduction of the noise volume, the measurement time and the image quality.

In a number of pulse sequences that are used in clinical magnetic resonance tomography (MRT)—for example in spin echo (SE) sequences or turbo spin echo (TSE) sequences—pulses known as gradient spoiler pulses (shortened to spoilers) are activated in addition to the gradient pulses necessary for spatial coding. Gradient spoiler pulses (which are also called gradient crusher pulses—shortened to crushers—in some cases, particularly if they occur in pairs) are emitted by the same gradient coils immediately before and/or after the actual gradient pulses, and ensure that (for example) unwanted free induction decay (FID) signals are suppressed. To ensure suppression of the FID signals with certainty, the spoilers or crushers must have a defined spoiler or crusher moment. In the present application, spoilers or spoiler pulses are normally used, and this designation always includes crushers as well. For differentiation, as used herein spoiler pulses that are emitted before or after slice-selection gradients are designated as gradient spoilers, while spoiler pulses that are executed before or after readout gradients are designated as readout spoilers.

As noted above, the time requirements within a pulse sequence are very strict. In addition, the total duration of a pulse sequence (which determines the total duration of an MRT examination) should be kept as short as possible. Therefore, not much time is provided for the execution of the spoilers. This means that the spoiler amplitudes must necessarily be high to achieve a defined spoiler moment, which leads to high edge steepness of the spoiler pulses directly.

A large part of the noise in MRT examinations, particularly given the use of SE or TSE sequences, therefore results from the spoiler pulses.

SUMMARY OF THE INVENTION

An object of the present invention is to provide a suitable optimization method as well as a corresponding pulse sequence optimization device for optimization of pulse sequences that include at least one refocusing pulse, a slice-selection gradient pulse and a gradient spoiler pulse.

in accordance with the invention, a pulse sequence whose parameters have been determined in a known manner is an input variable of the method to optimize a pulse sequence for a magnetic resonance system. The pulse sequence or its parameters result(s) from the imaging task to be achieved. The pulse sequence includes at least one refocusing pulse, a readout gradient pulse that occurs temporally after the refocusing pulse, and at least one readout spoiler pulse. The time length, amplitude and edge steepness of this readout spoiler are respectively determined. The readout spoiler pulse or readout spoiler lies chronologically before or after the readout gradient pulse. The pulse sequence can be a spin echo sequence or a turbo spin echo sequence, for example.

The pulse sequence is optimized for a noise reduction. The pulse duration of the readout gradient pulse is thereby shortened. The readout gradient produces a spatial coding during the readout (i.e. in the readout window) in a known manner. Shortening of the readout gradient pulse is equivalent to shortening the readout time and an increase of the readout bandwidth that is inversely proportional to the readout time. A readout gradient moment that affects the resolution of the image and should not be altered by the optimization is simultaneously provided by the pulse sequence to be optimized. The readout gradient moment is thus kept constant. A temporal shortening of the readout gradient pulse thus means an increase of the readout gradient strength (or, in other words, of the amplitude of the readout gradient pulse).

By shortening the pulse duration of the readout gradient pulse, more time is provided for the readout spoiler pulse without the time requirements (predetermined by the input pulse sequence) being changed, such that a pulse shape change is possible in order to achieve a reduction of the edge steepness. The pulse shape of the readout spoiler pulse is adapted without changing the total spoiler moment. The total spoiler moment results from the sum of the gradient spoiler moment and the readout spoiler moment. The two spoiler moment types can be merged since the suppression of FID signals is to be achieved independent of whether it is a gradient spoiler moment or a readout spoiler moment. An optimally shortened pulse duration of the readout gradient pulse is achieved when—given the adaptation of the pulse shape of the readout spoiler—a maximum amplitude of the readout spoiler pulse can be equated with the amplitude of the readout gradient pulse, and an edge steepness of the readout spoiler pulse is minimized. Such an adaptation of the pulse shape is possible when the amplitude of the readout gradient pulse has been sufficiently increased on the one hand, and on the other hand the pulse duration of the readout gradient pulse has been sufficiently shortened under consideration of the requirement that the readout gradient moment should remain unchanged. The pulse shape of the readout spoiler corresponds to a triangular shape if the aforementioned requirements are satisfied. The spoiler fuses with the readout gradient pulse. In the case of a spoiler pair before and after the slice-selection gradient pulse (for example what are known as crushers), the three pulses together yield a trapezoidal pulse.

The invention is based on the insight that it is possible to reduce the edge steepness of gradient pulses, and in particular of spoiler pulses, and therefore to bring about a noise reduction, by initially modifying parameters of a readout gradient pulse while maintaining predetermined chronological pulse intervals in order to therefore achieve a tolerance for variations in the gradient curve. According to the invention, a readout gradient pulse is optimized that is not the cause of the noise exposure. With this optimization, a noise volume reduction by approximately 15 to approximately 20 dBA is achieved relative to pulse sequences whose gradient curve has already been designed with regard to a noise minimization.

In a method according to the invention for the operation of a magnetic resonance system, according to the previously described method a pulse sequence is initially optimized and then the magnetic resonance system is operated using the optimized pulse sequence. Less noise arises during the measurement (i.e. when a patient is situated in a patient tunnel of the system) without there being losses in the image quality, and without the measurement duration being extended.

A pulse sequence optimization device according to the invention for the optimization of a pulse sequence for a magnetic resonance system has an input interface to receive parameters that define the pulse sequence. This is a pulse sequence that includes at least one refocusing pulse, a readout gradient pulse situated chronologically after the refocusing pulse and at least one readout spoiler pulse. For example, it can be an SE or a TSE sequence.

The pulse sequence optimization device also has a readout gradient pulse unit to determine a shortened pulse duration of the readout gradient pulse given a constantly maintained readout gradient moment. The pulse optimization device is configured to shorten the pulse duration of the readout gradient pulse, not the time intervals between successive pulses; what is known as the echo spacing remains unchanged. The echo time can also be freely selected by the user depending on his imaging task.

The pulse sequence optimization device also comprises a readout spoiler pulse unit to adapt the pulse shape of the readout spoiler pulse. The pulse shape adaptation takes place without a change of the total spoiler moment, thus of the integral of the pulse amplitude over time (or, graphically, without altering the area under the pulse amplitude).

An optimally shortened pulse duration of the readout gradient pulse is achieved when, in the adaptation of the pulse shape of the gradient spoiler pulse, a maximum amplitude of the readout spoiler pulse equals the amplitude of the readout gradient pulse, and an edge steepness of the readout spoiler pulse is minimized. The amplitude of the readout gradient pulse is increased due to the increase of the bandwidth of the readout gradient pulse in order to keep the readout gradient moment constant. At the same time, more time is provided for the readout spoiler pulse via the temporal shortening of the readout gradient pulse. Its amplitude can therefore be reduced given a simultaneous (temporal) widening of the pulse. In the optimal case, the pulse assumes a triangular shape; there is only just a rising edge or ramp, thus neither a flat amplitude curve nor a falling ramp.

Basic parts of the pulse sequence optimization device can be designed in the form of software components. This is particularly the case for the readout gradient pulse unit and the readout spoiler pulse unit. For example, the input interface can be an interface in order to accept data regarding a pulse sequence from a data store via a network or within a control device of a magnetic resonance system. The interface can be formed at least in part in the form of software and can possibly access hardware interfaces of an existing computer.

The invention thus also includes a non-transitory, computer-readable data storage medium that can be loaded directly into a memory of a pulse sequence optimization device, with program code segments that cause all steps of the method according to the invention to be executed when the program is run in the pulse optimization device. Such a realization in software has the advantage that previous devices that are used to determine pulse sequences (for example suitable computers in computing centers of the magnetic resonance manufacture) can be suitably modified via implementation of the program in order to optimize pulse sequences in the manner according to the invention, which pulse sequences are connected with a lower noise volume.

In an embodiment, the pulse shape of the readout gradient pulse is adapted without changing the readout spoiler moment. While the total spoiler moment includes both the readout spoiler moment and the gradient spoiler moment, it can be advantageous to leave only the readout spoiler moment unchanged. It is then unnecessary to consider the gradient spoiler moment.

The pulse sequence is preferably a spin echo sequence or a turbo spin echo sequence. In the optimization, an echo spacing can be left unchanged. The method can also be applied to other pulse sequences for a magnetic resonance system, assuming that these pulse sequences include at least one refocusing pulse, a readout gradient pulse chronologically situated after the refocusing pulse, and at least one readout spoiler pulse. The optimization does not affect the parameters that are decisive to the imaging.

The optimization can advantageously be conducted for a number of readout gradient pulses. Each steep edge produces a rapid current change in the corresponding gradient coil. If the edge steepness is reduced given multiple edges, a larger noise reduction is achieved.

The shortened pulse duration of the readout gradient pulse allows more time not only for the readout spoiler pulse but also for the slice-selection gradient spoiler pulses and the phase coding pulse. The edge steepness can therefore also advantageously be reduced for these pulses. It is noted again that edge steepness is frequently also designated as slew rate. Both the slice-selection gradient spoiler pulses an the phase coding pulses contribute to the noise development in a magnetic resonance system. If these edges are likewise designed to be flatter, this therefore leads to an additional noise reduction. This can be in a range from approximately 1 to approximately 10 dBA.

A modification of the edge steepness of the readout spoiler pulses, the gradient spoiler pulses and/or the phase coding pulses leads to a shift of the frequency spectrum. If the edge is flatter, lower frequencies are to be expected. It is thereby possible that these lower frequencies match an acoustic resonance frequency of the magnetic resonance system, such that the expected noise reduction does not occur in its full scope. In an embodiment of the method, if at least one acoustic resonance frequency of the magnetic resonance system lies within a frequency spectrum of the adapted readout spoiler pulse, the pulse duration of the refocusing pulses varies away from the optimally shortened pulse duration. This variation has the result that the frequency spectrum shifts and the acoustic resonance frequency lies outside of the frequency spectrum. The achieved noise reduction is then greater than with the actual optimally shortened pulse duration, although the edge steepness increases again. It is possible to determine this variation of the pulse duration in an iterative process to avoid an acoustic resonance frequency.

In another embodiment, an optimization can also include the pulse duration of the refocusing pulses. The pulse duration of the refocusing pulses is shortened, which leads to an adaptation of the pulse duration of the simultaneously executed slice-selection gradient pulses to the shortened pulse duration of the refocusing pulses. In order to select the same slice thickness as before the shortening of the pulse duration of the refocusing pulses, an amplitude of the slice-selection gradient pulse is increased accordingly. The shortening of the pulse duration enables the adaptation of a pulse shape of a gradient spoiler pulse without changing a total spoiler moment, wherein an optimally shortened pulse duration of the refocusing pulses is achieved when—given the adaptation of the pulse shape of the gradient spoiler pulse—a maximum amplitude of the gradient spoiler pulse can be set equal to the amplitude of the slice-selection gradient pulse, and an edge steepness of the gradient spoiler pulse is minimized. An additional time margin for spoilers is thus achieved, such that an additional reduction of edge steepness is possible.

DESCRIPTION OF THE PREFERRED EMBODIMENTS

Figure 1:
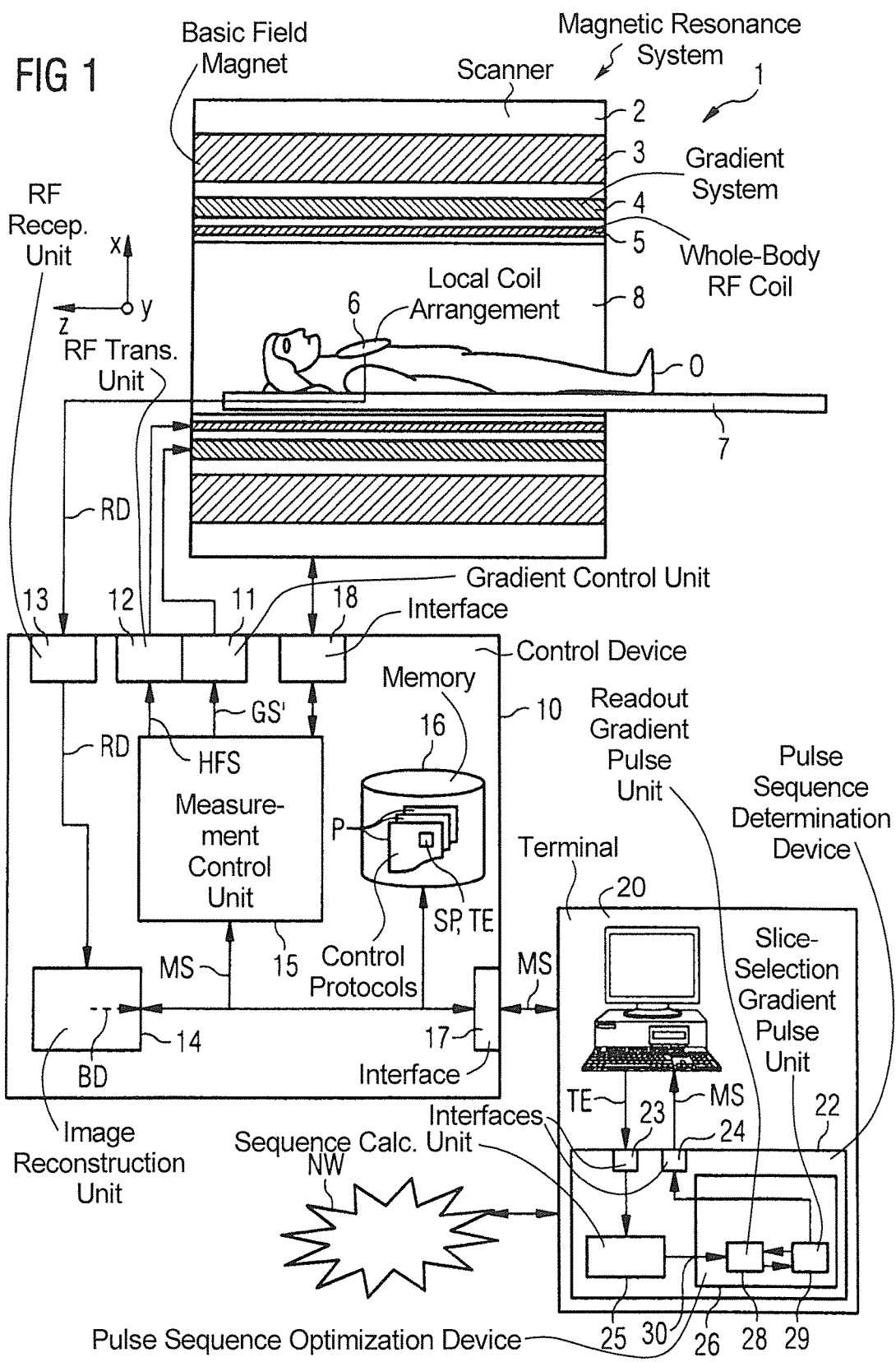
FIG. 1 schematically illustrates an exemplary embodiment of a magnetic resonance system according to the invention.

A magnetic resonance system 1 according to the invention is schematically shown in FIG. 1. It includes the actual magnetic resonance scanner 2 with an examination space or patient tunnel located therein. A bed 7 can be driven into this patient tunnel 8, such that a patient O or examination subject lying on said bed 7 can be supported at a defined position within the magnetic resonance scanner 2 relative to the magnet system and radio-frequency system arranged therein during an examination or can also be moved between different positions during a measurement.

Basic components of the magnetic resonance scanner are a basic field magnet 3, a gradient system 4 with magnetic field gradient coils to generate magnetic field gradients in the x-, y- and z-directions, and a whole-body radio-frequency coil 5. The magnetic field gradient coils can be controlled independently of one another in the x-, y- and z-direction so that gradients can be applied in arbitrary logical spatial directions (for example in the slice-selection direction, in the phase coding direction or in the readout direction) via a predetermined combination, wherein these directions normally depend on the selected slice orientation. The reception of magnetic resonance signals induced in the examination subject O can take place via the whole-body coil 5 with which the radio-frequency signals are normally also emitted to induce the magnetic resonance signals. However, these signals are typically received with a local coil arrangement 6 with (for example) local coils (of which only one is shown here) placed on or below the patient O. All of these components are known in principle to those skilled in the art and therefore are only schematically shown in FIG. 1.

The components of the magnetic resonance scanner 2 can be controlled by a control device 10. This can be a control computer which can be formed by a number of individual computers (which may be spatially separated and connected among one another via suitable cables or the like). This control device 10 is connected via a terminal interface 17 with a terminal 20 via which an operator can control the entire system 1. In the present case, this terminal 20 (as a computer) is equipped with keyboard, one or more monitors and additional input devices (for example mouse or the like) so that a graphical user interface is provided to the operator.

Among other things, the control device 10 has a gradient control unit 11 that can in turn comprise multiple sub-components. Via this gradient control unit 11, the individual gradient coils are connected with control signals according to a gradient pulse sequence GS. As describe above, these are gradient pulses that are radiated (activated) at precisely provided time positions and with a precisely predetermined time curve during a measurement.

The control device 10 moreover has a radio-frequency transmission unit 12 in order to feed electrical signals respectively representing radio-frequency pulses into the whole-body radio-frequency coil 5 according to a predetermined radio-frequency pulse sequence RFS of the pulse sequence MS. The radio-frequency pulse sequence RFS includes the excitation and refocusing pulses mentioned above. The reception of the magnetic resonance signals then occurs with the aid of the local coil arrangement 6, and the raw data RF received from this, are read out and processed by an RF reception unit 13. The magnetic resonance signals are passed in digital form as raw data RF to a reconstruction unit 14, which reconstructs the image data BD from the raw data and stores the image data BD in a memory 16 and/or passes the image data BD via the interface 17 to the terminal 20 so that the operator can view the image. The image data BD can also be stored at other locations via a network NW and/or be displayed and evaluated. Alternatively, a radio-frequency pulse sequence can be emitted via the local coil arrangement and/or the magnetic resonance signals can be received by the whole-body radio-frequency coil (not shown).

Control commands are transmitted via an additional interface 18 to other components of the magnetic resonance scanner 2 (such as the bed 7 or the basic field magnet 3, for example), or measurement values or, respectively, other information are obtained.

The gradient control unit 11, the RF transmission unit 12 and the RF reception unit 13 are controlled, coordinated respectively, by a measurement control unit 15. Via corresponding commands, this ensures that the desired gradient pulse sequences GS and radio-frequency pulse sequences RFS are emitted. Moreover, for this purpose it must be ensured that the magnetic resonance signals are read out at the local coils of the local coil arrangement 6 by the RF reception unit 13 at the appropriate point in time and are processed further. The measurement control unit 15 likewise controls the interface 18.

The basic operation of such a magnetic resonance measurement and the cited components to control it are known to those skilled in the art, such that they need not be described in further in detail herein. Moreover, such a magnetic resonance scanner 2 and the associated control device can have an additional components that are likewise not explained in detail herein. It should also be noted that the magnetic resonance scanner 2 can also be designed differently—for example with a laterally open patient space, or as a smaller scanner in which only one body part is positioned.

In order to start a measurement, via the terminal an operator can typically select a control protocol P provided for this measurement from a memory 16 in which a number of control protocols P for different measurements are stored. Among other things, this control protocol P includes various control parameters SP, TE for the respective measurement. Numbering among these control parameters are specific basic rules for the desired pulse sequence, for example whether it is a spin echo sequence, a turbo spin echo sequence etc. Additionally counting among these are control parameters with regard to the magnetizations to be achieved via the individual radio-frequency pulses, rules about the k-space trajectory to be used to enter the raw data into k-space as well as parameters that set slice thicknesses, slice intervals, number of slices, echo time TE in a spin echo sequence, etc.

With the use of the terminal 20, the operator can modify a portion of these control parameters in order to create an individual control protocol for a currently desired measurement. For this, variable control parameters are offered for modification at a graphical user interface of the terminal, for example.

Moreover, via a network NW the operator can retrieve control protocols (for example from a manufacturer of the magnetic resonance system) and then possibly modify and use these.

A measurement sequence MS is then determined based on the control parameters SP including the selected time parameters TE, with which measurement sequence SP the actual control of the remaining components via the measurement control unit 15 ultimately takes place. The pulse sequence MS can be calculated in a pulse sequence determination device 22, which here is shown as part of the terminal 20 and, for example, can be realized in the form of software components at the computer of this terminal 20. In principle, however, the pulse sequence determination device 22 can also be part of the control device 10 itself, in particular of the measurement control unit 15. However, the pulse sequence determination device could also similarly be realized at a separate computer system which is connected with the magnetic resonance system via the network NW, for example.

The pulse sequence determination device has an input interface 23 to accept control parameters SP, TE. The control parameters SP, TE are passed to a pulse sequence calculation unit 25 that determines a pulse sequence. A pulse sequence optimization device 26 according to the invention can be integrated into the pulse sequence determination device 22 or be executed as a separate block. This includes the output signal of the pulse sequence calculation unit 25 as an input signal at an input interface 27.

The pulse sequence optimization device 26 comprises a readout gradient pulse unit 28 and a readout spoiler pulse unit 29 in which the optimization according to the invention is conducted. The units 28 and 29 are connected with one another. A return of data from each unit to each unit can occur for an iterative determination of the optimized pulse sequence.

The optimized pulse sequence can be supplied as an output again via a pulse sequence interface 24 and, for example, can be passed via the terminal interface 17 to the measurement control unit 15 so that the measurement then proceeds fully automatically. Parameters of the optimized pulse sequence can be displayed at the terminal to the user and thus be accepted or rejected by him. However, the optimization can also run fully automatically without the user receiving knowledge of this, or at least receiving no communication of details about individual parameter changes. That is possible since the pulse optimization here has an effect only on the noise development, but has no influence on the image quality. As has already been mentioned above, not only a pulse sequence but rather a series of such pulse sequences that are then executed in series) is typically generated for a measurement in order to thus acquire the necessary raw data RF for the desired image data BD.

Figure 2:
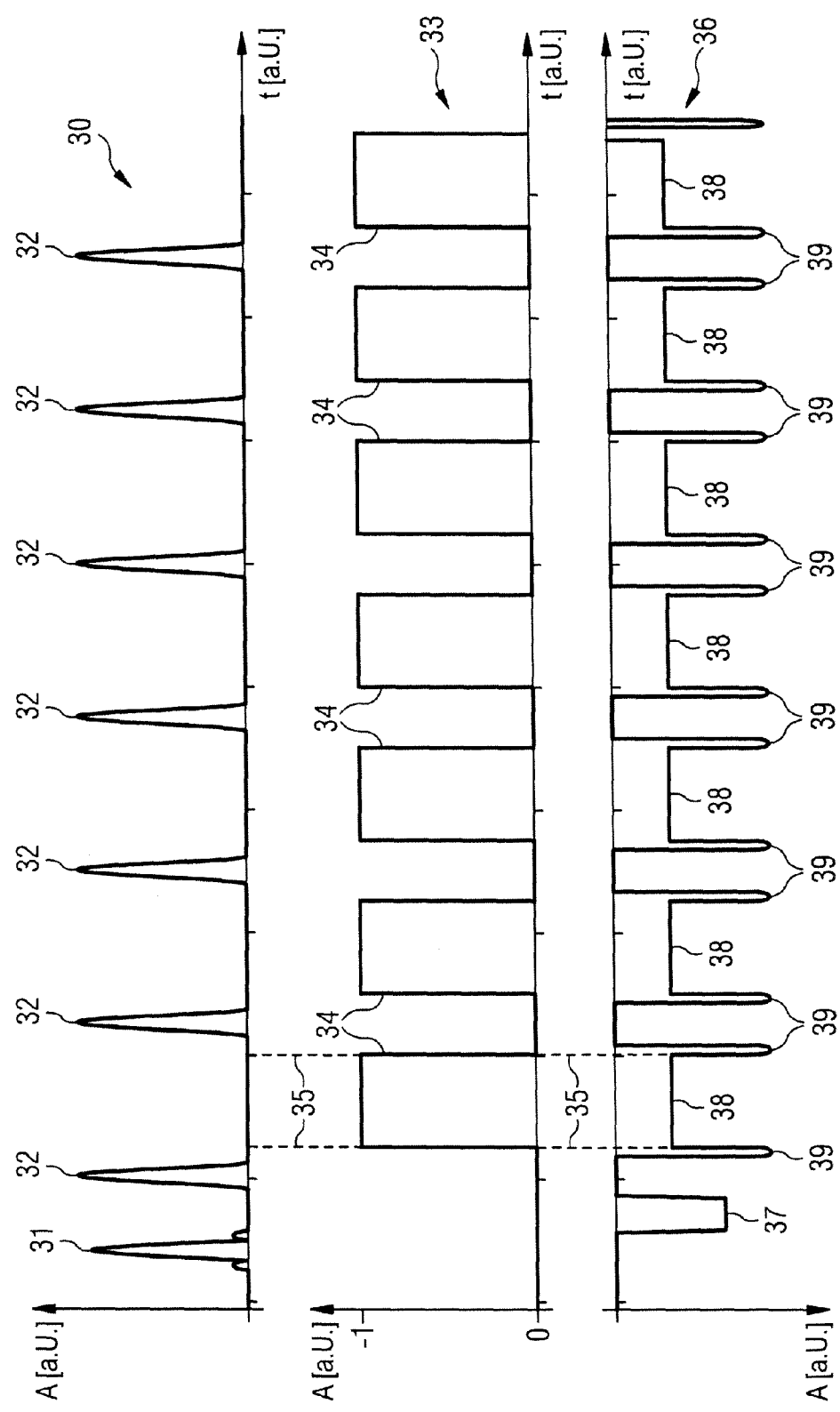
FIG. 2 shows an example of a pulse sequence to which the method according to the invention can be applied.

FIG. 2 shows a pulse sequence to which the method according to the invention can be applied. In a graph 30, the amplitude of radio-frequency pulses is plotted over time in arbitrary units. A pulse 31 is an excitation pulse that is calculated so that it deflects defined atomic nuclear spins by a defined flip angle. The excitation pulse is not affected by the optimization according to the invention. Refocusing pulses 32 follow this pulse 31.

In a graph 33 (that is shown below graph 30), the output signal of an analog/digital converter is plotted. The amplitude is again shown in arbitrary units over time in arbitrary units. The amplitude jumps between a value of "0" and a value of "1". If the value is equal to "1", it is read out. The signal 34 in graph 33 thus shows what is known as the readout window. The readout windows lie between the refocusing pulses, as is indicated with dashed lines 35. The readout window is temporally situated so that the corresponding echo is received.

A graph 36 (that is shown below graph 33) shows the associated readout gradient curves, wherein the amplitude is shown in arbitrary units over time in arbitrary units. A first gradient pulse 37 is apparent chronologically after the excitation pulse 31; it is not explained in detail here since it is unimportant to the understanding of the invention. Readout gradient pulses 38 subsequently follow. These are temporally situated precisely in the readout window 34, as is indicated by the dashed lines 35. Each readout gradient pulse 38 is provided with a readout spoiler pair or readout crusher 39 that provides for the suppression of FID signals. The moment of this spoiler is decisive for the suppression of the unwanted FID signals. The spoiler pulses must be placed in the short time period between decaying refocusing pulse and beginning readout window. Since the moment is defined by the area of the pulse or, respectively, by the integral of the amplitude over time, the spoiler pulses 39 have a high amplitude and corresponding to a large edge steepness that not inconsiderably contributes to the noise exposure in the magnetic resonance systems.

Figure 3:
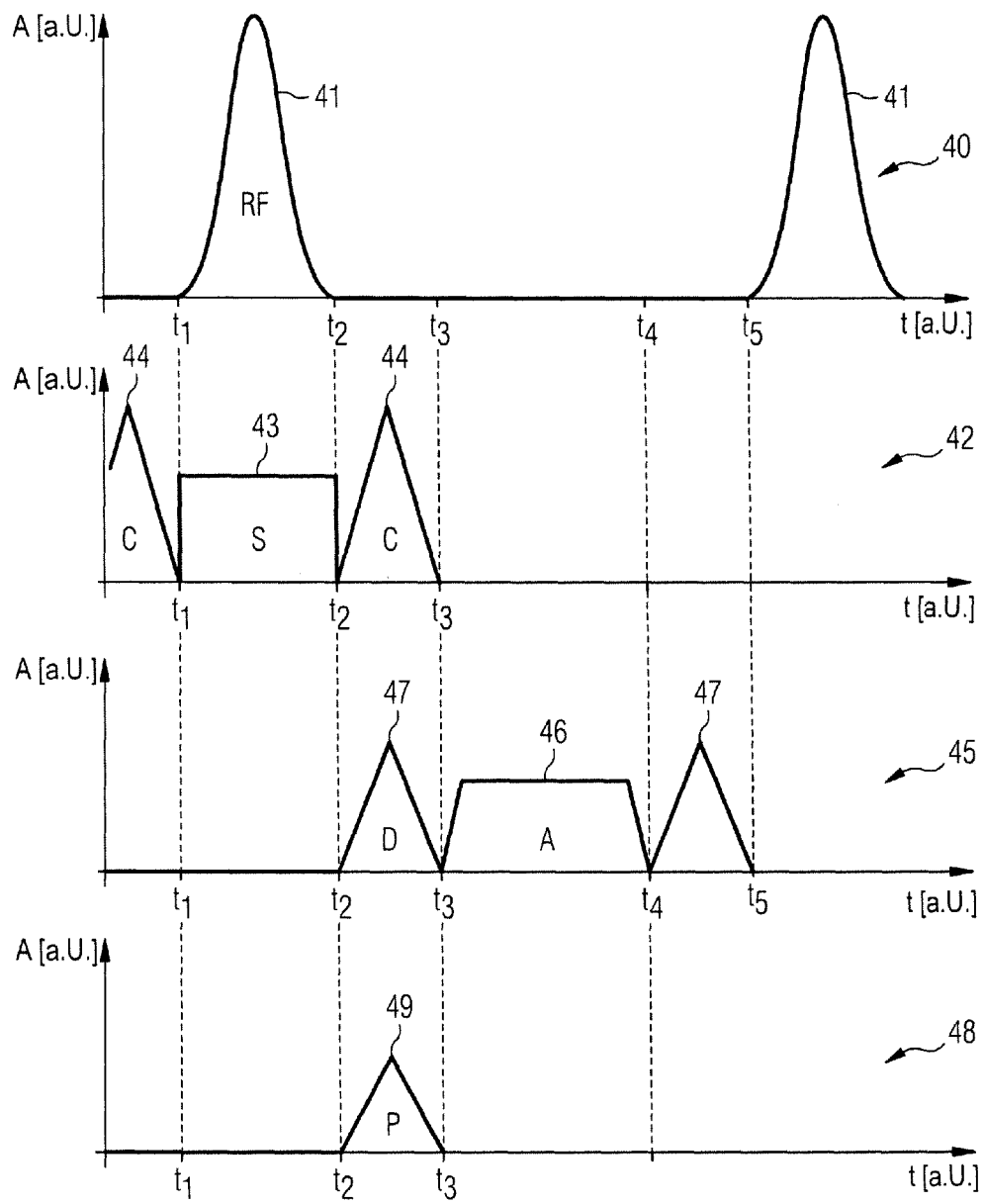
FIG. 3 schematically illustrates a portion of a pulse sequence to which the method according to the invention can be applied, for explanation of temporal correlations.

The temporal correlations between the individual pulse series (including the slice-selection gradients and phase coding gradients not shown in FIG. 2) should be explained using FIG. 3. FIG. 3 shows (very schematically) a pulse sequence in four graphs lying one below another, to which pulse sequence the method according to the invention can be applied. Two successive radio-frequency pulses 41 with an amplitude over time (respectively in arbitrary units) are plotted in a graph 40. The radio-frequency pulses 41 should be refocusing pulses, for example corresponding to the refocusing pulses 32 in FIG. 2.

An amplitude curve over time of a slice-selection gradient is indicated below this in a graph 42. The presentation again takes place in arbitrary units. A slice-selection gradient pulse 43 with a moment S is flanked by two gradient spoilers 44 with a spoiler moment of C, respectively. The slice-selection gradient provides for the selection of the slice at which the simultaneously executed radio-frequency pulse should act.

The amplitude over time of a readout gradient is plotted in arbitrary units in a graph 45 situated below this. A readout gradient pulse 46 with a readout gradient moment A is flanked by two readout spoilers 47 with a readout spoiler moment of D, respectively.

The amplitude curve of a phase coding gradient over time is likewise plotted in arbitrary units in a graph 48 situated below this. A phase coding gradient pulse 49 provides for a spatial coding in the phase coding direction.

The first refocusing pulse 41 begins at a point in time $t_1$ and ends at a point in time $t_2$. The difference $\Delta t = t_2 - t_1$ designates the pulse duration of the refocusing pulse 41. The slice selection gradient pulse 43 is executed simultaneously with the refocusing pulse 41, meaning that the slice selection gradient pulse 43 likewise begins at the point in time $t_1$ and ends at the point in time $t_2$. It ensures that the refocusing pulse 41 acts on a selected slice. There is subsequently a readout window from the time $t_3$ to the time $t_4$, in which the readout gradient pulse 56 is executed. The phase coding gradient 49 (which begins at the point in time $t_2$ and ends at the point in time $t_3$) is executed before the readout gradient pulse 46 and after the slice selection gradient pulse 43. Following the readout gradient pulse 46, in the time from $t_4$ to $t_5$ a concluding readout spoiler pulse 47 is executed. The following refocusing pulse 41 (which is consequently executed after the concluding readout spoiler pulse 47) begins at the point in time $t_5$.

The time interval between two refocusing pulses 41—"$t_5 - t_1$"—is the echo interval, what is known as the echo spacing ESP. This echo spacing can remain unchanged according to the invention. The spoiler pulses—i.e. both the slice selection gradient spoiler pulses 44 and the readout spoiler pulses 47—serve to suppress FID signals. For this they must have a specific total spoiler moment C+D. The duration of the spoiler pulses is predetermined by the end of the first refocusing pulse 41 at the point in time $t_2$ and the chronological beginning of the readout window (i.e. of the readout gradient pulse 46) at the point in time $t_3$ or, respectively, accordingly by the points in time $t_4$ and $t_5$. In order to be able to achieve the spoiler moment that suppresses the FID signals, the amplitudes of the spoiler pulses are high (as is clearly apparent in FIG. 2) since the provided time is strictly limited. If it is not desired to vary the echo spacing and the echo time, there is barely any margin for a variation of the spoiler pulses. The inventive method is applied here.

Figure 4:
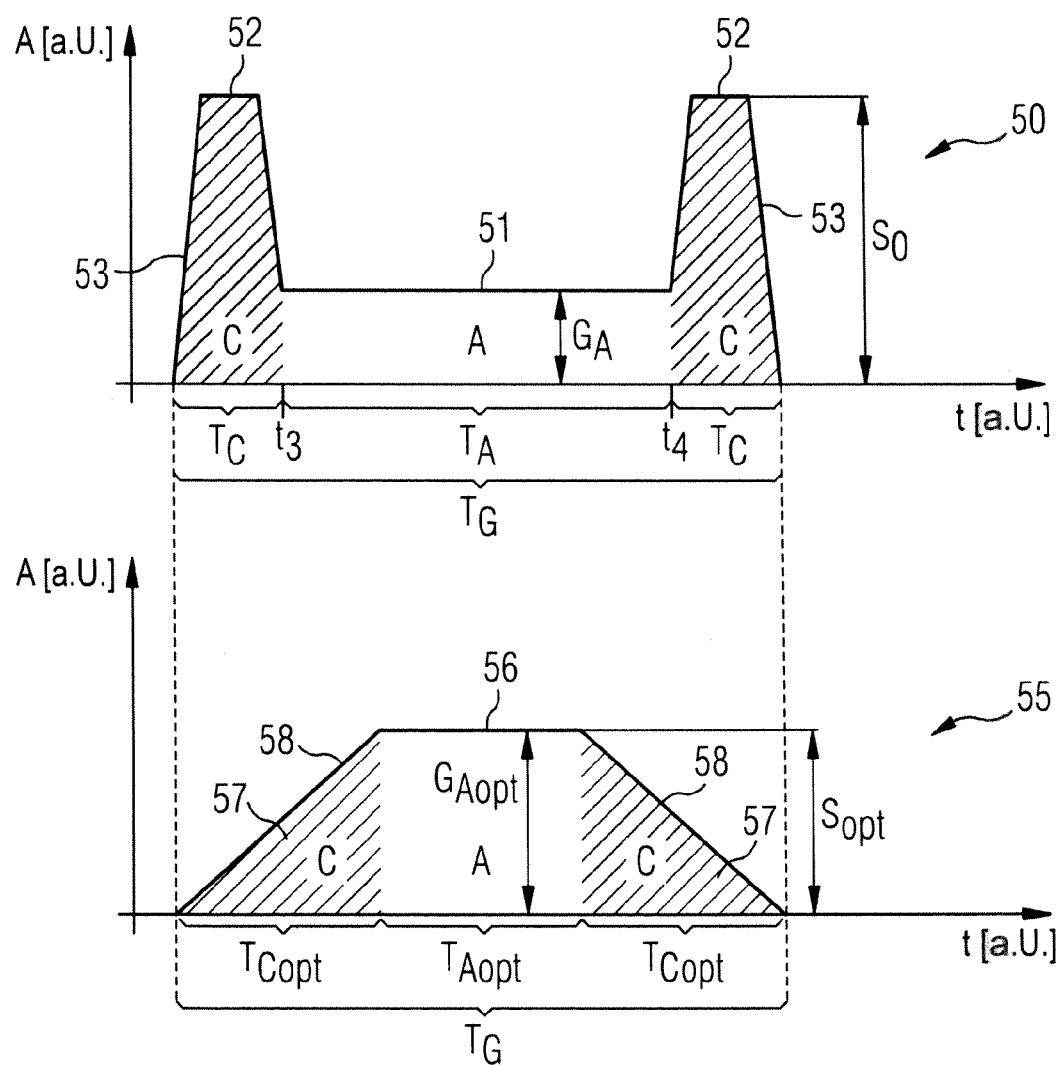
FIG. 4 schematically illustrates a readout gradient pulse with two readout spoiler pulses in unoptimized form and optimized form.

FIG. 4 shows a detail of FIG. 3 in a graph 50. A readout gradient pulse 51 that can correspond to the readout gradient pulses 38 from FIG. 2 and the readout gradient pulse 46 from FIG. 3 is plotted in arbitrary units with its readout spoiler pulses 52 (corresponding to readout spoilers 47 and readout spoilers 39) with its amplitude over time in arbitrary units. The readout gradient pulse 51 begins at a time $t_3$ and ends at a time $t_4$; its pulse duration is $T_A$. The amplitude of the readout gradient pulse 51 is $G_A$. A total duration $T_G$ is predetermined by the echo time or, respectively, the echo spacing. The spoiler or crusher pulses 52 respectively have a duration $T_C$ that results from $$T_C = (T_G - T_A) \div 2 \qquad (1)$$

The area of the crusher pulses 52 (shown shaded in FIG. 4)—thus the moment—is predetermined for a certain suppression of FID signals. An amplitude $S_0$ for the crusher pulses 52 is thus established with a predetermined duration $T_C$. The rise time is short, meaning that an edge 52 is very steep; the slew rate $\Delta S_0/dt$ is high.

A graph 55 (lying under the graph 50 in FIG. 4) shows a gradient curve optimized according to the invention, with an optimized pulse duration $T_{Aopt}$ for the readout gradients. The amplitude of a readout gradient pulse 56 and flanking readout gradient pulses 57 is plotted over time in arbitrary units in graph 55. The total duration $T_G$ for the execution of readout gradient pulse 56 and the readout spoiler pulses 57 is unmodified relative to the graph 50. The echo spacing of the refocusing pulses and the readout window have not changed in this case. The readout gradient pulse 56 has a temporal length $T_{Aopt}$ and an amplitude $G_{Aopt}$. Pulse duration and amplitude are optimized according to the invention.

It is thereby to be heeded that the readout gradient moment A—i.e. the area of the readout gradient pulse in FIG. 4, or in other words the integral of amplitude $G_A$ of the readout gradient pulse over time $T_A$—is predetermined by the resolution. This means that the readout moment A is established with the input pulse sequence. In the optimization, the readout bandwidth BW is increased to an optimal value. The amplitude $G_A$ (or, in other words, the readout gradient strength G of the readout gradient pulse) also increases proportionally with the increase of the bandwidth, and the required readout duration $T_A$ decreases. Therefore, according to Equation (1), of the total time $T_G$ provided more time remains for the crushers. The optimization achieves a shortening of the readout duration $T_A$ with an increase of the amplitude $G_A$; the readout gradient moment remains constant.

In that $T_{Aopt}$ is smaller than $T_A$, more time is thus provided for the spoiler pulses 57. The predetermined spoiler moment C—i.e. the predetermined area content of the shaded area that is bounded by the spoiler pulse amplitude and the time axis and is provided by the original spoiler pulses 52—can now be achieved in a triangular area. An edge 58 is significantly flatter than the edge 53; the slew rate $\Delta S/dt$ is lower. An amplitude $S_{opt}$ of the spoiler pulses 57 is smaller than the amplitude $S_0$ of the spoiler pulses 52 and just as large as the amplitude $G_{Aopt}$ of the readout gradient pulse 56.

The moment C of the spoiler gradients—i.e. the area C of the spoiler pulses 52 or, respectively, 57 in FIG. 4—depends on the resolution or the pixel size in the readout direction, and does not change with the readout bandwidth. With a shortening of the readout duration $T_A$, more space is provided for the spoiler pulse duration $T_C$. An optimum is found when the spoiler amplitude S is just as large as the amplitude $G_A$ of the readout gradient pulse.

The constant spoiler moment is provided by:

$$C = \tfrac{1}{2} G_A \cdot T_C \qquad (2)$$

If a spoiler pair as in FIG. 4 is assumed and the total duration $T_G$ is taken into account, $$C = \tfrac{1}{4} G_A \cdot (T_G - T_A) = \tfrac{1}{4} G_A \cdot (T_G - A \div G_A) \qquad (3)$$

results.

A is the readout gradient moment predetermined by the resolution,
C is the spoiler moment,
$G_A$ is the gradient strength,
$T_C$ is the duration of the spoiler,
$T_G$ is the total duration, and
$T_A$ is the duration of the readout gradient pulse.

The optimal gradient strength $G_A$ is then provided by $$G_A = (4 \cdot C + A) \div T_G \qquad (4)$$

If the resolution R is used, the optimal bandwidth $BW_{opt}$ results as $$BW_{opt} = \gamma \cdot G_A \cdot R = \gamma \cdot (4 \cdot C + A) \div T_G R \qquad (5)$$

wherein γ as the gyromagnetic ratio.

In contrast to a change of the echo spacing, neither sharpness nor contrast of the image changes with a bandwidth alteration of the readout gradient pulse. Only the signal-to-noise ratio SNR decreased with increased bandwidth, wherein SNR is proportional to the square root of 1/bandwidth.

$$SNR \propto \sqrt{1/BW} \qquad (6)$$

For example, given an increase of the bandwidth from 100% to 150%, the signal-to-noise ratio drops from 100% to 81%. If spin echo sequences or turbo spin echo sequences are assumed as pulse sequences, this worsening of the signal-to-noise ratio is not disruptive. (T)SE sequences are normally characterized by a very high signal-to-noise ratio, such that the image quality remains practically unaffected by the indicated worsening of the signal-to-noise ratio.

The optimized pulse sequence with a gradient curve as shown in graph 55 of FIG. 4 leads to a noise volume reduction by up to 15 to approximately 20 dBA relative to pulse sequences that were already optimized within their gradient curve.

It can be seen from FIG. 3 that the fundamental pulse shape of the slice-selection gradient pulse 43 with gradient spoilers 44 is similar to the pulse shape of the readout gradient pulse 46 with readout spoilers 47. A reduction of the edge steepness of the gradient spoiler 44 can be achieved analogous to the presentation in FIG. 4 if the pulse duration of the slice-selection gradients is shortened. In one embodiment (not shown in detail here), for this the pulse duration $\Delta t$ of the refocusing pulses 41 is shortened in order to enable a temporal shortening of the slice-selection gradient pulse 43. Maintaining the selected slice entails an increase of an amplitude of the slice-selection gradient pulse 43, which allows a corresponding optimization of the edge steepness of the gradient spoiler. Via a temporal shortening of both the slice-selection gradient 43 and the readout gradient 46, the duration $t_3 - t_2$ can be increased overall, which in combination entails a further reduction of the noise.

In some cases, depending on the magnetic resonance system that is used an optimal noise minimization cannot be achieved with the optimal gradient curve according to graph 55 (FIG. 4) because an acoustic resonance frequency of the magnetic resonance system is excited precisely at this gradient curve. For example, the optimized pulse sequence can therefore also have a readout gradient curve as shown in a graph 60 in FIG. 5.

Figure 5:
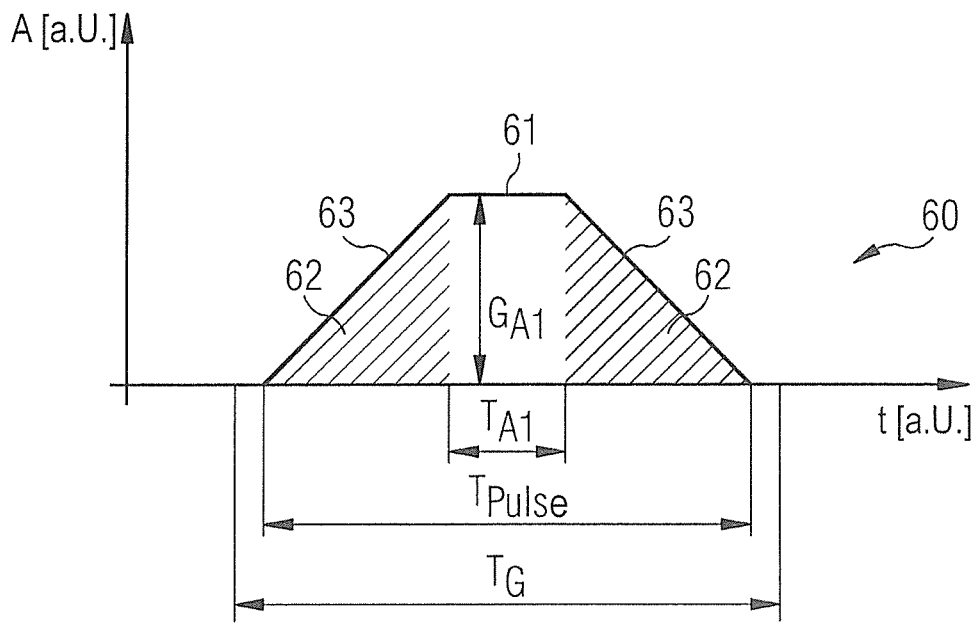
FIG. 5 shows a readout gradient pulse with two readout spoiler pulses that are suboptimally adapted.

The amplitude of the gradient pulses over time (respectively in arbitrary units) is again plotted in graph 60. A readout gradient pulse 61 has an amplitude $G_{A1}$ that is greater than the amplitude $G_A$ and greater than the amplitude $G_{Aopt}$. The pulse duration $T_{A1}$ is shorter than the optimal pulse duration $T_{Aopt}$ and shorter than the original duration $T_A$. This in turn means that the bandwidth of the readout gradient is greater than the original bandwidth BW and greater than the optimal bandwidth $BW_{opt}$. In FIG. 5, the spoiler pulses 62 have an amplitude that is as large as $G_{A1}$. A trapezoidal shape of the total pulse is achieved again. The spoiler pulses thus have a higher amplitude than in the optimal case according to graph 55. The duration of the spoiler pulses therefore must be reduced in order to maintain the same spoiler moment. The total pulse duration $T_{Pulse}$ of spoiler pulse, slice-selection gradient pulse and second spoiler pulse is therefore less than $T_G$, meaning that the entire total time $T_G$ that is provided is not utilized.

The gradient curve shown in graph 60 is not the optimal curve since edges 63 of the spoiler pulses 62 are steeper than the edges 58 of the spoiler pulses 57, thus in principle causes a higher noise exposure. For the reasons explained above, graph 60 can nevertheless be the optimized pulse sequence in order to avoid an acoustic resonance.

Figure 6:
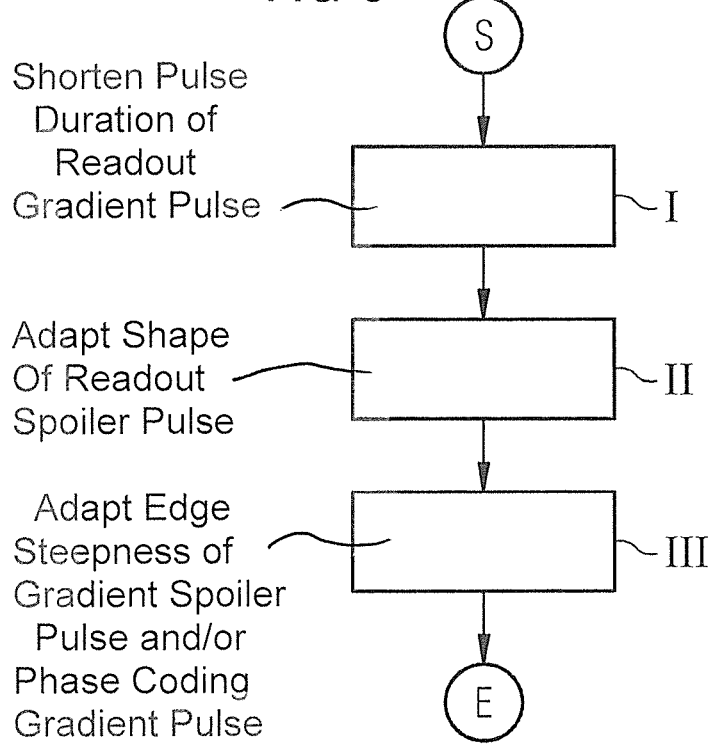
FIG. 6 is a flowchart of the method according to the invention.

FIG. 6 shows a flowchart of an embodiment of the method according to the invention. The input variable at the start S of the method is a pulse sequence that was calculated for a defined imaging task. In Step I, a pulse duration of the readout gradient pulse is shortened. In Step II, a pulse shape of the readout spoiler pulse is adapted without changing a total spoiler moment. An optimally shortened pulse duration of the readout gradient pulse is achieved when, in the adaptation of the pulse shape of the readout spoiler pulse, a maximum amplitude of the readout spoiler pulse can be sequence equal to the amplitude of the readout gradient pulse and an edge steepness of the readout spoiler pulse is minimized.

An edge steepness of a slice-selection gradient spoiler pulse and/or of a phase coding pulse can be reduced in Step III in adaptation to the shortened pulse duration of the readout gradient pulse.

Result E of the method is an optimized pulse sequence that leads to a lower noise development.

In conclusion, it is noted again that the methods and designs described in detail in the preceding are exemplary embodiments, and the basic principle can be varied in wide ranges by those skilled in the art without departing the scope of the invention. In particular, it is again noted that the method according to the invention can be applied not only to spin echo methods, and turbo spin echo methods, but also to other sequences.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to optimize a pulse sequence for operating a magnetic resonance data acquisition scanner in order to acquire magnetic resonance data comprising:
   providing an unoptimized pulse sequence as an input to a processor, said unoptimized pulse sequence including at least one refocusing pulse, a readout gradient pulse that occurs in said sequence temporally after the refocusing pulse, and at least one readout spoiler pulse, and said unoptimized pulse sequence, when used to operate said magnetic resonance data acquisition scanner, causing said scanner to execute a scan, having a scan duration and an associated scanner noise level, in order to acquire said magnetic resonance data with a data resolution;
   in said processor, automatically shortening a pulse duration of said readout gradient pulse while keeping a readout gradient moment constant;
   in said processor, adapting a pulse shape of the readout spoiler pulse, without changing a total spoiler moment, so as to produce an optimally shortened pulse duration of the readout spoiler pulse that occurs when, by adapting the pulse shape of the readout spoiler pulse, a maximum amplitude of the readout spoiler pulse equals the amplitude of the readout gradient pulse and an edge steepness of the readout spoiler pulse is minimized;
   transforming said unoptimized pulse sequence into an optimized pulse sequence comprising the readout spoiler pulse having said optimally short duration and adapted pulse shape, and said readout gradient pulse with the adapted pulse duration, and making the optimized pulse sequence available at an output of the processor in electronic form in a format configured to use said optimized pulse sequence to operate said magnetic resonance system; and
   from said processor, operating said magnetic resonance data acquisition scanner to execute a scan with said optimized pulse sequence with a lower noise level than, and the same scan duration and data resolution as in, the scan executed with said unoptimized pulse sequence.

2. A method as claimed in claim 1 comprising adapting said pulse shape of said readout spoiler pulse without changing the readout spoiler moment thereof.

3. A method as claimed in claim 1 comprising selecting said unoptimized pulse sequence supplied to said processor from the group consisting of spin echo sequences having an echo spacing and turbo spin echo sequences having an echo spacing, and comprising producing said optimally shortened pulse duration of the refocusing pulse and adapting the pulse shape of the gradient spoiler pulse while leaving said echo spacing unmodified.

4. A method as claimed in claim 3 wherein said unoptimized pulse sequence supplied to said processor comprises a plurality of readout gradient pulses, and comprising producing said optimally shortened pulse duration for each of multiple readout gradient pulses in said plurality of readout gradient pulses.

5. A method as claimed in claim 1 wherein said unoptimized pulse sequence also comprises a slice selection gradient spoiler pulse and a phase coding pulse, each having an edge steepness, and comprising reducing the edge steepness of at least one of said slice selection gradient pulse and said phase coding pulse in adaptation to the shortened pulse duration of the readout gradient pulse.

6. A method as claimed in claim 1 wherein said magnetic resonance system has at least one acoustic resonance frequency that is within a frequency spectrum of the adapted gradient spoiler pulse and comprising, in said processor, determining whether said readout gradient pulse with said optimally shortened pulse duration causes said frequency spectrum to shift so that said acoustic resonance frequency is outside of said frequency spectrum and, if so, modifying the pulse duration of the readout gradient pulse to deviate from said optimally shortened pulse duration.

7. A method as claimed in claim 1 wherein the step of providing said unoptimized pulse sequence as an input to a processor comprises providing an unoptimized pulse sequence that includes a slice selection gradient pulse and a gradient spoiler pulse, and wherein said method further comprises:
   in said processor, automatically shortening a pulse duration of said refocusing pulse;
   in said processor, automatically adapting a pulse duration of the slice selection gradient pulse to the shortened pulse duration of the refocusing pulse;
   in said processor, increasing an amplitude of the slice selection gradient pulse to cause a same slice thickness to be selected by the slice selection pulse as before shortening of the pulse duration of the refocusing pulse; and
   in said processor, adapting a pulse shape of the gradient spoiler pulse, without changing a total spoiler moment, so as to produce an optimally shortened pulse duration of the refocusing pulse that occurs when, by adapting the pulse shape of the gradient spoiler pulse, a maximum amplitude of the gradient spoiler pulse equals the amplitude of the slice selection gradient pulse and an edge steepness of the gradient spoiler pulse is minimized.

8. A magnetic resonance apparatus comprising:

a magnetic resonance data acquisition scanner;

a pulse optimization computer comprising:

a processor having an input interface provided with an unoptimized pulse sequence as an input to the processor, said unoptimized pulse sequence including at least one refocusing pulse, a readout gradient pulse that occurs in said sequence temporally after the refocusing pulse, and at least one readout spoiler pulse, and said unoptimized pulse sequence, when used to operate said magnetic resonance data acquisition scanner, causing said scanner to execute a scan, having a scan duration and an associated scanner noise level, in order to acquire said magnetic resonance data with a data resolution;

said processor being configured to automatically shorten a pulse duration of said readout gradient pulse while keeping a readout gradient moment constant;

said processor being configured to adapt a pulse shape of the readout spoiler pulse, without changing a total spoiler moment, so as to produce an optimally shortened pulse duration of the readout spoiler pulse that occurs when, by adapting the pulse shape of the readout spoiler pulse, a maximum amplitude of the readout spoiler pulse equals the amplitude of the readout gradient pulse and an edge steepness of the readout spoiler pulse is minimized;

said processor being configured to transform the unoptimized pulse sequence into an optimized pulse sequence comprising the readout spoiler pulse having said optimally short duration and adapted pulse shape, and said readout gradient pulse with the adapted pulse duration, and to make the optimized pulse available at an output interface of the processor in electronic form in a format configured to use said optimized pulse sequence to operate said magnetic resonance data acquisition scanner; and a control unit supplied with said optimized pulse sequence from said output interface of said processor of said pulse sequence optimization computer, said control unit being configured to operate said data acquisition scanner to execute a scan with said optimized pulse sequence with a lower noise level than, and the same scan duration and data resolution as in, the scan executed with said unoptimized pulse sequence.

9. A non-transitory, computer-readable data storage medium computer system of a magnetic resonance apparatus and comprises a magnetic resonance data acquisition scanner encoded with programming instructions, said data storage medium being loaded into a and said programming instructions causing said computer system to:

receive an unoptimized pulse sequence as an input to the processor, said unoptimized pulse sequence including at least one refocusing pulse, a readout gradient pulse that occurs in said sequence temporally after the refocusing pulse, and at least one readout spoiler pulse, and said unoptimized pulse sequence, when used to operate said magnetic resonance data acquisition scanner, causing said scanner to execute a scan, having a scan duration and an associated scanner noise level, in order to acquire said magnetic resonance data with a data resolution;

automatically shorten a pulse duration of said readout gradient pulse while keeping a readout gradient moment constant;

adapt a pulse shape of the readout spoiler pulse, without changing a total spoiler moment, so as to produce an optimally shortened pulse duration of the readout spoiler pulse that occurs when, by adapting the pulse shape of the readout spoiler pulse, a maximum amplitude of the readout spoiler pulse equals the amplitude of the readout gradient pulse and an edge steepness of the readout spoiler pulse is minimized;

transform the unoptimized pulse sequence into an optimized pulse sequence comprising the readout spoiler pulse having said optimally short duration and adapted pulse shape, and said readout gradient pulse with the adapted pulse duration, and make the optimized pulse sequence available at an output of the processor in electronic form in a format configured to use said optimized pulse sequence to operate said magnetic resonance data acquisition scanner; and operate the magnetic resonance data acquisition scanner to execute a scan with said optimized pulse sequence with a lower noise level than, and the same scan duration and data resolution as in, the scan executed with said unoptimized pulse sequence.

* * * * *